US012700851B2

(12) United States Patent
Couriol et al.

(10) Patent No.: US 12,700,851 B2
(45) Date of Patent: Aug. 4, 2026

(54) PARASITIC CAPACITANCE MITIGATION CIRCUIT FOR RELAXATION OSCILLATORS

(71) Applicant: University of Utah Research Foundation, Salt Lake City, UT (US)

(72) Inventors: Matthieu A. Couriol, Salt Lake City, UT (US); Pierre-Emmanuel Gaillardon, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 18/819,744

(22) Filed: Aug. 29, 2024

(65) Prior Publication Data

US 2025/0080087 A1      Mar. 6, 2025

Related U.S. Application Data

(60) Provisional application No. 63/579,317, filed on Aug. 29, 2023.

(51) Int. Cl.
H03K 3/011 (2006.01)
H03K 3/0231 (2006.01)
H03K 4/06 (2006.01)
(52) U.S. Cl.
CPC ........... H03K 3/011 (2013.01); H03K 3/0231 (2013.01); H03K 4/066 (2013.01)
(58) Field of Classification Search
CPC ........ H03K 3/011; H03K 3/0231; H03K 3/03; H03K 3/0315; H03K 4/066; H03K 4/06; H03K 3/354; H03B 5/24
See application file for complete search history.

(56) References Cited

U.S. PATENT DOCUMENTS 6,043,633 A      3/2000 Lev et al.
6,055,848 A  *  5/2000 Weigold ............... G01N 27/122
340/634

(Continued)

FOREIGN PATENT DOCUMENTS

CN          108832896 A      11/2018
WO      WO-2025023205 A1 *  1/2025  ............. G01R 27/02

OTHER PUBLICATIONS

Ferri et al., A single-chip integrated interfacing circuit for wide-range resistive gas sensor arrays, Sensors and Actuators B: Chemical, vol. 143, Issue 1, 2009, pp. 218-225, ISSN 0925-4005, https://doi.org/10.1016/j.snb.2009.09.002.

(Continued)

*Primary Examiner* — Ryan Johnson
(74) *Attorney, Agent, or Firm* — Thorpe North & Western, LLP

(57)          ABSTRACT

A parasitic capacitance mitigation circuit for a relaxation oscillator. The parasitic capacitance mitigation circuit includes a first switch coupled across a parasitic capacitance of a resistive sensing element and a second switch coupled between the parasitic capacitance and a reference voltage node. The parasitic capacitance mitigation circuit includes a pulse generator configured to: monitor a voltage across the parasitic capacitance; detect a voltage transient across the parasitic capacitance; and generate a pulse control signal in response to detecting the voltage transient. In response to the pulse control signal, the first switch opens and the second switch closes to discharge the parasitic capacitance through the second switch.

20 Claims, 6 Drawing Sheets

(56) References Cited

U.S. PATENT DOCUMENTS

| | | | |
|---|---|---|---|
| 6,377,129 | B1 | 4/2002 | Rhee et al. |
| 6,700,392 | B2 | 3/2004 | Haase |
| 8,058,937 | B2 | 11/2011 | Qin et al. |
| 8,575,947 | B1 | 11/2013 | Walsh et al. |
| 10,090,805 | B2 | 10/2018 | Madala et al. |
| 11,120,826 | B1 | 9/2021 | Johnson et al. |
| 2013/0063166 | A1* | 3/2013 | Ng ...................... G01R 31/343 |
| | | | 324/120 |
| 2014/0286472 | A1* | 9/2014 | Iwasa .................... G01K 7/203 |
| | | | 377/25 |
| 2021/0003460 | A1* | 1/2021 | Cobb ...................... G01L 1/144 |
| 2022/0294432 | A1 | 9/2022 | Tajalli et al. |
| 2023/0060745 | A1 | 3/2023 | Tong et al. |

OTHER PUBLICATIONS

Heidary et al., "Features and Design Constraints for an Optimized SC Front-End Circuit for Capacitive Sensors With a Wide Dynamic Range," IEEE Journal of Solid-State Circuits, vol. 43, No. 7, pp. 1609-1616, Jul. 2008, doi: 10.1109/JSSC.2008.922390.

Hu et al., "A constant charging-current relaxation oscillator with a duty-cycled main comparator and an adaptive auxiliary comparator," Microelectronics Journal, vol. 128, 2022, 105566, ISSN 1879-2391, https://doi.org/10.1016/j.mejo.2022.105566.

Radogna, A.V. et al.; "A 296 nJ Energy-per-Measurement Relaxation Oscillator-Based Analog Front-End for Chemiresistive Sensors," IEEE Transactions on Circuits and Systems I: Regular Papers, vol. 68, No. 3, pp. 1123-1133, Mar. 2021, doi: 10.1109/TCSI.2020.3047508.

Zhou, W. et al; "A 3-MHz 17.3-μW 0.015% Period Jitter Relaxation Oscillator With Energy Efficient Swing Boosting," IEEE Transactions on Circuits and Systems II: Express Briefs, vol. 67, No. 10, pp. 1745-1749, Oct. 2020, doi: 10.1109/TCSII.2019.2948032.

* cited by examiner

600

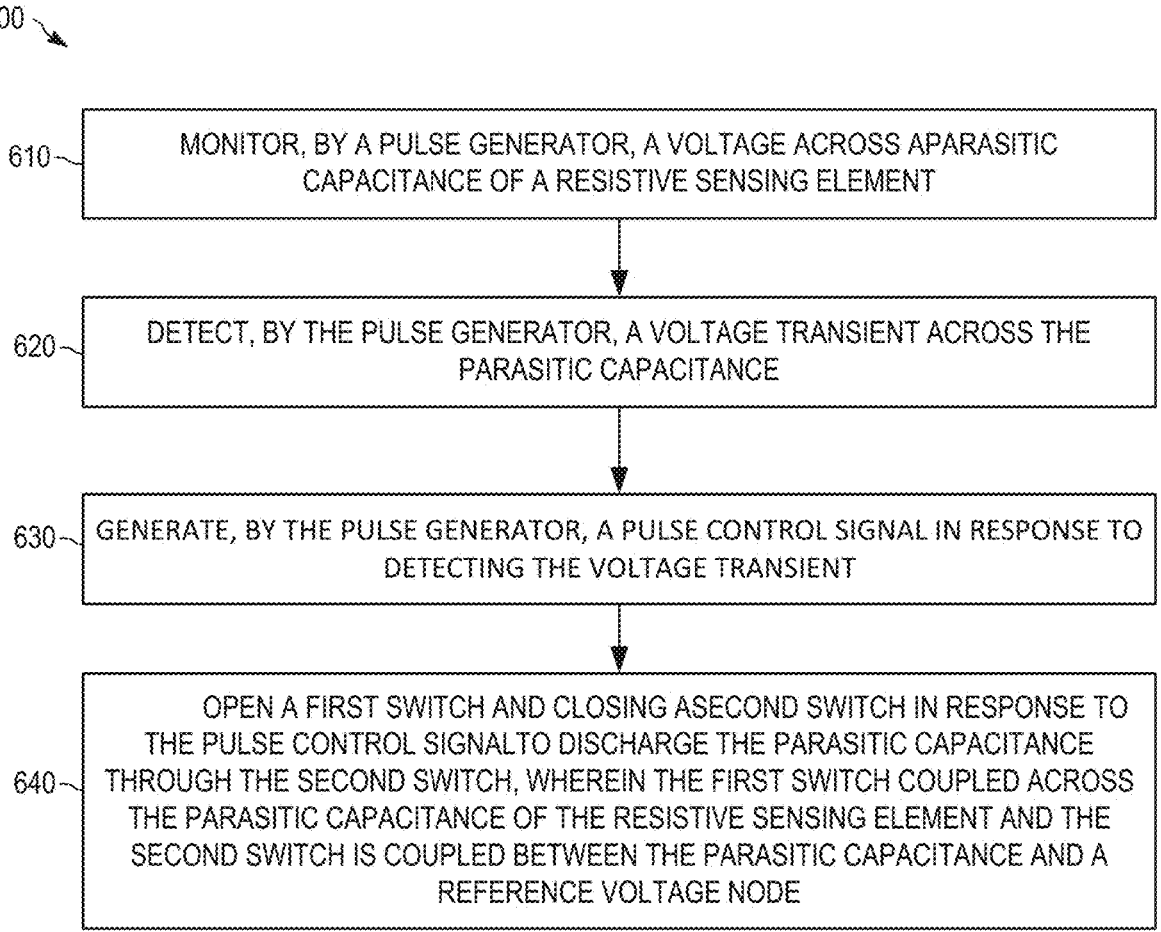

610 — MONITOR, BY A PULSE GENERATOR, A VOLTAGE ACROSS APARASITIC CAPACITANCE OF A RESISTIVE SENSING ELEMENT

620 — DETECT, BY THE PULSE GENERATOR, A VOLTAGE TRANSIENT ACROSS THE PARASITIC CAPACITANCE

630 — GENERATE, BY THE PULSE GENERATOR, A PULSE CONTROL SIGNAL IN RESPONSE TO DETECTING THE VOLTAGE TRANSIENT

640 — OPEN A FIRST SWITCH AND CLOSING ASECOND SWITCH IN RESPONSE TO THE PULSE CONTROL SIGNALTO DISCHARGE THE PARASITIC CAPACITANCE THROUGH THE SECOND SWITCH, WHEREIN THE FIRST SWITCH COUPLED ACROSS THE PARASITIC CAPACITANCE OF THE RESISTIVE SENSING ELEMENT AND THE SECOND SWITCH IS COUPLED BETWEEN THE PARASITIC CAPACITANCE AND A REFERENCE VOLTAGE NODE

FIG. 6

PARASITIC CAPACITANCE MITIGATION CIRCUIT FOR RELAXATION OSCILLATORS

CROSS REFERENCE TO RELATED APPLICATIONS

This application claims priority to U.S. Provisional Application No. 63/579,317, filed Aug. 29, 2023, which is incorporated herein by reference.

STATEMENT REGARDING FEDERALLY SPONSORED RESEARCH OR DEVELOPMENT

This invention was made with government support under D19AP00028 awarded by the Defense Advanced Research Projects Agency. The government has certain rights in the invention.

NAMES OF THE PARTIES TO A JOINT RESEARCH AGREEMENT

Not applicable.

INCORPORATION BY REFERENCE STATEMENT

Not applicable.

BACKGROUND

Relaxation oscillators maximum sampling frequency is limited by the parasitic capacitance of the measured resistance. Currently, there are no solutions to remove the effect of the parasitic capacitance. Various approaches have attempted to solve the challenge with variable gain in the oscillator to increase the sampling frequency but this does not remove the effect of the parasitic capacitance while also allowing for better sampling frequency. Adding a gain stage (of a gain G) increases the sampling frequency by G times, but the effect of the parasitic capacitor is increased by G times as well. Therefore, the system maximum sampling frequency is still limited by the parasitic capacitor.

SUMMARY

Parasitic capacitance mitigation circuits for a relaxation oscillator circuits can be designed and implemented with a first switch coupled across a parasitic capacitance of a resistive sensing element and a second switch coupled between the parasitic capacitance and a reference voltage node. The parasitic capacitance mitigation circuit includes a pulse generator configured to: monitor a voltage across the parasitic capacitance; detect a voltage transient across the parasitic capacitance; and generate a pulse control signal in response to detecting the voltage transient. In response to the pulse control signal, the first switch opens and the second switch closes to discharge the parasitic capacitance through the second switch.

The resistive sensing element and the parasitic capacitance can be associated with a sensor. As a general guideline, the pulse control signal can have a pulse width from 1 and 5 microseconds. In one aspect, the first switch comprises transmission gates configured to open or close in response to the pulse control signal. In another aspect, the second switch comprises transmission gates configured to open or close in response to the pulse control signal. In an additional aspect, the first and second switches comprise transmission gates configured to open and close complementary to each other in response to the pulse control signal. The pulse generator is configured to detect edges in a feedback signal of the relaxation oscillator; and generate the pulse control signal based on the detected edges in the feedback signal, wherein the detected edges in the feedback signal correspond to the voltage transients across the resistive sensing element. The feedback signal of the relaxation oscillator can be an output signal of the oscillator. In other words, the output signal with a delay can be the feedback signal which corresponds to the voltage transient across the resistive element. As a general guideline, "edge" refers to both a rising edge and falling edge in a digital signal (i.e. a signal that can be either a logical 0 or a logical 1). A rising edge occurs when the input signal is transitioning from a low state (e.g. 0) to a high state (e.g. 1) while a falling edge occurs when the input signal is transitioning from a high state (e.g. 1) to a low state (e.g. 0).

The parasitic capacitance mitigation circuit can include a short delay element configured to delay the feedback signal, wherein delaying the feedback signal aligns timing of the pulse control signal with the voltage transient across the resistive sensing element. The reference voltage node can be configured to provide half of a supply voltage. It should be noted that opening the first switch and closing the second switch to discharge the parasitic capacitance through the second switch to discharge the parasitic capacitance increases an oscillation frequency of the relaxation oscillator. The second switch discharges the parasitic capacitance within 1 and 5 microseconds. Notably, the delay period is different than the discharge period. The delay period (e.g. a couple nanoseconds) allows for the discharging circuit (e.g. Switch S2) to be configured and settle to a state where it is ready to discharge. The discharge period is a fixed period for a given discharging circuit design (e.g. that can be changed during design phase) with a typical value of 1 μs. The longer this period, the larger the parasitic capacitance that can be handled by the circuit. Thus, this can be varied to suit a particular design or application.

The parasitic capacitance mitigation circuit can include latch coupled to an output of a comparator of the relaxation oscillator. The latch can be configured to filter spurious output transitions of the comparator caused by noise. It should be noted that filtering the spurious transitions prevents unstable oscillation behavior of the relaxation oscillator at high resistive sensor values.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 6 depicts a method for using a parasitic capacitance mitigation circuit for relaxation oscillators in accordance with an example.

Figure 1:
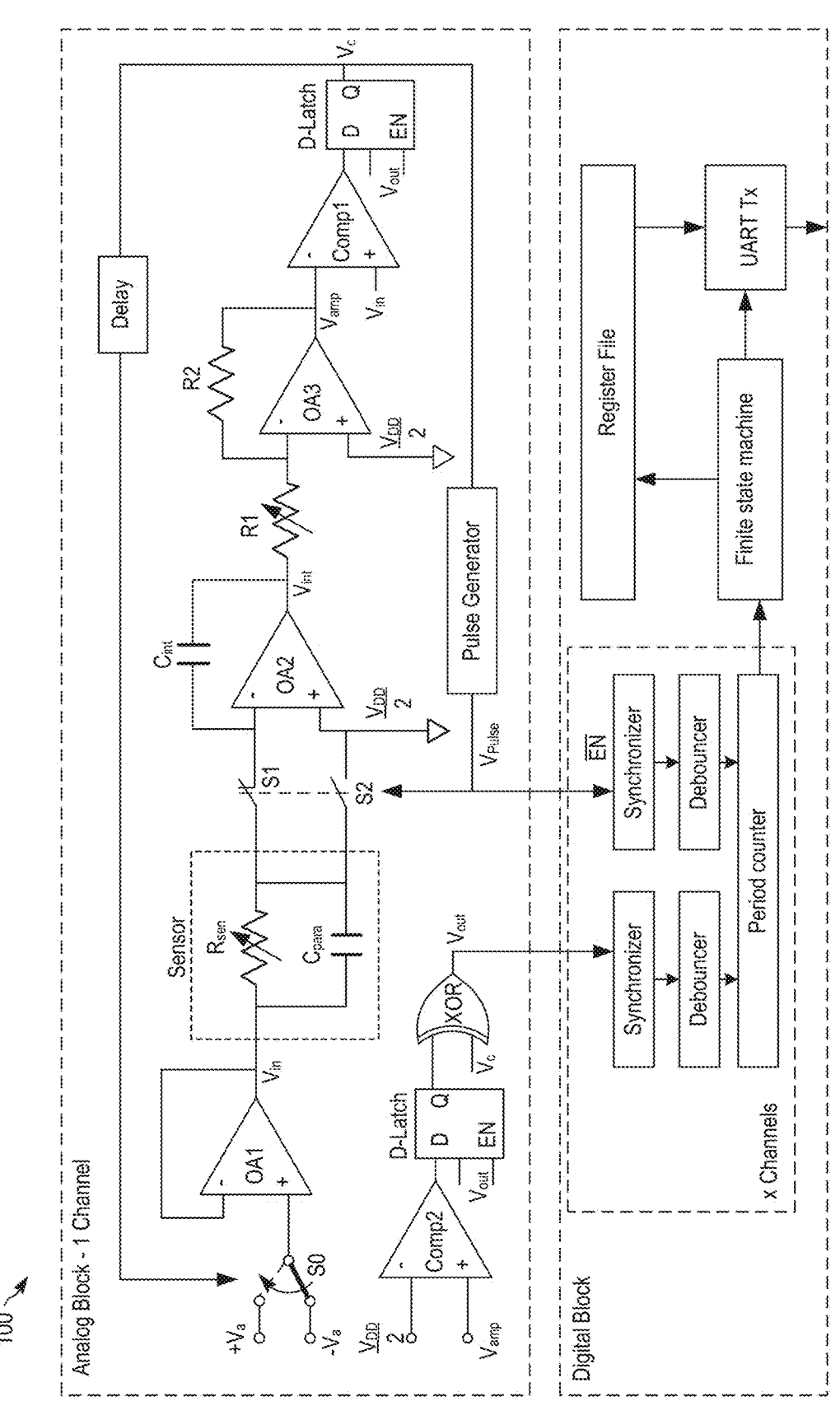
FIG. 1 is a diagram of an analog front-end and digital logic of a parasitic capacitance mitigation circuit for a relaxation oscillator circuit in accordance with one example.

These drawings are provided to illustrate various aspects of the invention and are not intended to be limiting of the scope in terms of dimensions, materials, configurations, arrangements or proportions unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

Definitions

In describing and claiming the present invention, the following terminology will be used.

The singular forms "a," "an," and "the" include plural referents unless the context clearly dictates otherwise. Thus, for example, reference to "a switch" includes reference to one or more of such features and reference to "the pulse generator" refers to one or more of such elements.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

As used herein, the term "about" is used to provide flexibility and imprecision associated with a given term, metric or value. The degree of flexibility for a particular variable can be readily determined by one skilled in the art. However, unless otherwise enunciated, the term "about" generally connotes flexibility of less than 2%, and most often less than 1%, and in some cases less than 0.01%.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "at least one of" is intended to be synonymous with "one or more of." For example, "at least one of A, B and C" explicitly includes only A, only B, only C, or combinations of each.

Numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of about 1 to about 4.5 should be interpreted to include not only the explicitly recited limits of 1 to about 4.5, but also to include individual numerals such as 2, 3, 4, and sub-ranges such as 1 to 3, 2 to 4, etc. The same principle applies to ranges reciting only one numerical value, such as "less than about 4.5," which should be interpreted to include all of the above-recited values and ranges. Further, such an interpretation should apply regardless of the breadth of the range or the characteristic being described.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Example Embodiments

The fast rise in anthropogenic emissions has led to the development of pollution monitoring platforms to mitigate the human health risks inherent to contaminated air. These pollution monitoring deployments use dense networks of Internet of Things (IoT) nodes built with particle matter (PM) and carbon dioxide ($CO2$) sensors can create a very detailed map of air quality in an urban environment. However, pollution is defined as contamination of the indoor or outdoor environment by any chemical, physical or biological agent that modifies the natural characteristics of the atmosphere. Therefore, to accurately determine the quality of air and array of sensors is needed to detect a range of unhealthy pollutants. Recent research has been focused on using an array of low-cost sensors and machine learning (ML) to better estimate complex air composition. Emerging nanofiber sensors greatly fit this purpose due to their low cost and low power, but they lack the low impedance of other types of sensors which makes them challenging to interface with at high sampling rate that is required by ML. The current technology demonstrates that the sampling frequency of relaxation oscillators with highly resistive sensors is limited by the parasitics of the interfaced sensors. Accordingly, embodiments described herein provide low trade-off parasitics mitigation circuitry to improve sampling frequency when interfacing highly resistive sensors using resistance-to-frequency converters. The sampling frequency is limited by parasitics as discussed below along with the mitigation circuitry.

A typical relaxation oscillator circuit 100, having an analog block and a digital block, for interfacing a wide range of resistance is shown in FIG. 1. In one example, a parasitic capacitance mitigation circuit is provided for a relaxation oscillator 100 and can include a first switch (e.g., S1) coupled across a parasitic capacitance of a resistive sensing element ($R_{sen}$); a second switch (e.g., S2) coupled between the parasitic capacitance and a reference voltage node; and a pulse generator configured to: monitor a voltage across the parasitic capacitance; detect a voltage transient across the parasitic capacitance; and generate a pulse control signal in response to detecting the voltage transient, wherein in response to the pulse control signal, the first switch opens and the second switch closes to discharge the parasitic capacitance through the second switch.

Thus, In FIG. 1, a parasitic capacitance mitigation circuit includes a pulse generator configured to: monitor a voltage across the parasitic capacitance; detect a voltage transient across the parasitic capacitance; and generate a pulse control signal in response to detecting the voltage transient. In response to the pulse control signal, a first switch (S1) opens and the second switch closes to discharge the parasitic capacitance through a second switch (S2).

The resistive sensing element ($R_{sen}$) and the parasitic capacitance ($C_{para}$) can be associated with a sensor. A pulse control signal can have a pulse width from 1 and 5 microseconds. In one aspect, the first switch (e.g., S1) comprises transmission gates configured to open or close in response to the pulse control signal. In another aspect, the second switch (S2) comprises transmission gates configured to open or close in response to the pulse control signal. In an additional aspect, the first and second switches (e.g., S1 and S2) comprise transmission gates configured to open and close complementary to each other in response to the pulse control signal.

The pulse generator can be configured to detect edges in a feedback signal of a relaxation oscillator; and generate the pulse control signal based on the detected edges in the feedback signal. The detected edges in the feedback signal correspond to the voltage transients across the resistive sensing element ($R_{sen}$). The feedback signal of the relaxation oscillator can be an output signal of the oscillator. In other words, the output signal with a delay can be the feedback signal which corresponds to the voltage transient across the resistive element. As a general guideline, "edge" refers to both a rising edge and falling edge in a digital signal (i.e. a signal that can be either a logical 0 or a logical 1). A rising edge occurs when the input signal is transitioning from a low state (e.g. 0) to a high state (e.g. 1) while a falling edge occurs when the input signal is transitioning from a high state (e.g. 1) to a low state (e.g. 0).

The parasitic capacitance mitigation circuit can include a short delay element configured to delay the feedback signal, wherein delaying the feedback signal aligns timing of the pulse control signal with the voltage transient across the resistive sensing element ($R_{sen}$). The reference voltage node can be configured to provide half of a supply voltage. It should be noted that opening the first switch and closing the second switch to discharge the parasitic capacitance through the second switch to discharge the parasitic capacitance increases an oscillation frequency of the relaxation oscillator. The second switch discharges the parasitic capacitance within 1 and 5 microseconds. Notably, the delay period is different than the discharge period. The delay period (e.g. a couple nanoseconds) allows for the discharging circuit (e.g. Switch S2) to be configured and settle to a state where it is ready to discharge. The discharge period is a fixed period for a given discharging circuit design (e.g. that can be changed during design phase) with a typical value of 1 μs. The longer this period, the larger the parasitic capacitance that can be handled by the circuit. Thus, this can be varied to suit a particular design or application.

The parasitic capacitance mitigation circuit can include latch (e.g., D-latch) coupled to an output of a comparator (e.g., Comp1) of the relaxation oscillator. The latch can be configured to filter spurious output transitions of the comparator caused by noise. It should be noted that filtering the spurious transitions prevents unstable oscillation behavior of the relaxation oscillator at high resistive sensor values.

Thus, the relaxation oscillator circuit 100 includes the pulse generator, the delay component, and switch S1 and switch S2, which represents a parasitics mitigation circuit, as illustrated herein. This architecture generates a squared output signal Vc which period Tc depends on the sensor's resistive sensing element $R_{sen}$ as:

$$T_C = 4\left(\frac{R_{sen}C_{int}}{G}\right).$$

The operational amplifier (OA) such as, for example, OA1 generates $V_{in}$ to bias the sensor at either $$V_{sen} = \frac{V_{DD}}{2} + V_a = 1 \text{ V} \text{ or } V_{sen} = \frac{V_{DD}}{2} - V_a = -1 \text{ V}.$$

At DC, (when $V_{in}$ has settled at either $+V_a$ or $-V_a$ and $$\left.\frac{dV_{in}}{dt} = 0\right)$$

all the current $I_{int}$ charging the integration capacitor $C_{int}$ is going through $R_{sen}$ and $$|I_{int}| = |V_{sen}|/R_{sen}.$$

However, during transient and when $$\frac{dV_{in}}{dt} \neq 0,$$

the impedance Zc-para of the parasitic capacitor of the sensor Cpara is non-negligible and $$I_{int} = C_{para}\frac{dV_{in}}{dt}.$$

7

Figure 2:
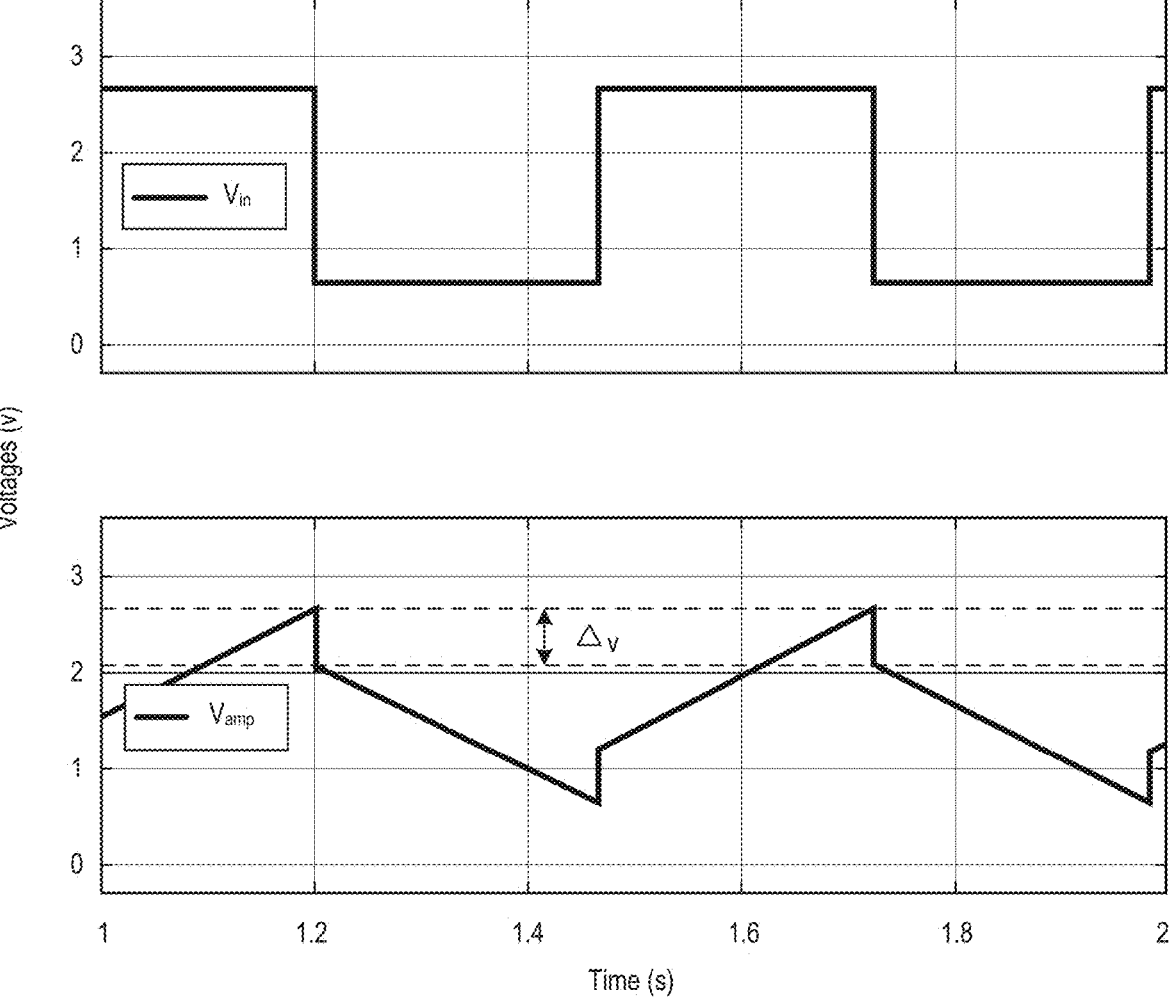
FIG. 2 is a graph of a post-PEX transient simulation without parasitic mitigation circuitry in accordance with one example.

The equivalent circuitry between $V_{in}$ and $V_{amp}$ is an inverting amplifier with a transient gain $G_{tran}$ of $$G_{tran} = \frac{Z_{c-para}}{Z_{c-int}} * \frac{R_2}{R_1} \qquad (5)$$

during transient. This creates a $\Delta V$ error at $V_{amp}$ as shown in FIG. 2, which impacts the oscillation period $T_c$ of the converter as shown in equation 1.

$$T_C = \frac{4R_{sen}C_{int}}{G}\left(1 - \frac{GC_{para}}{C_{int}}\right) \text{ where } G = \frac{R_2}{R_1}. \qquad (1)$$

The oscillation frequency $$F = \frac{1}{T_C}$$

has an infinite value when $$\frac{GC_{para}}{C_{int}} = 1$$

and negative value when $$\frac{GC_{para}}{C_{int}} > 1$$

which is not physically possible. In fact, this equation defines the limit of usable G and $C_{int}$ for a given sensor. If $C_{int}$ is picked too low or G picked too high, the $\Delta V$ error shown in FIG. 2 becomes higher than the thresholds of the comparator, where FIG. 2 depicts Post-PEX (parasitic extraction) transient simulation without parasitic mitigation circuitry. As a result, the circuit enters a nonstable state and oscillates at a frequency defined by its loop delay $T_{d-loop}$ dependent on the delay $T_d$ for each OA (e.g., OA1, OA2, OA3). Thus, the value of $C_{int}$ and G may be specifically selected to ensure the loop does not enter this state. Substituting the value $C_{int}$ into the ideal oscillation period of the loop $$T_C = 4\left(\frac{R_{sen}C_{int}}{G}\right),$$

the equivalent minimum $T_c$ this architecture can establish is achieved and is defined by the sensor's resistance and parasitic capacitance. These parasitics limit the sampling frequency of the architecture to the fabrication and technological capabilities of the sensors. For this reason, the present embodiments mitigate the effect of the parasitic capacitance $C_{para}$ of the sensor to decorrelate the sampling frequency of the sensor's interface, from the sensor's parasitics.

The following more specifically addresses the parasitics mitigation circuitry. In one example, typical values for nanofiber based sensors can be $C_{para}$=3-5 pF; $R_{sen}$=1-10 G$\Omega$; $C_{int}$>60 pF; $T_c$>120 ms. At least one period of $T_c$ is used in order to sample the oscillation period of the loop and subsequently the value of $R_{sen}$. This results in previous works being limited to a maximum sampling rate of one measurement every 120 ms.

$$C_{int} > C_{para} \cdot G \Leftrightarrow Tc > 4R_{sen}C_{int}, \qquad (2)$$

In one example, the illustrated embodiments of the circuitry to mitigate the effect of the parasitics capacitance $C_{para}$ from the sensor can be represented by the pulse generator, the delay component, and switch S1 and switch S2 in FIG. 1. The circuit detects when a transient is going to occur across the sensor (when $$\frac{dV_{sen}}{dt} \neq 0\Big)$$

and toggles the two switches S1 and S2 right before $V_{in}$ changes. The control of the switches (e.g., S1 and S2) can happen before $V_{in}$ changes voltage and this is ensured by adding a short delay block of a few nanoseconds (<5 ns) in the feedback loop between $V_c$ and S0 using inverters. The pulse generator detects any edges on $V_c$ and triggers a pulse of about 1 μs in below 1 ns.

When the pulse is high, S1 is open and S2 is closed for 1 μs. In this example, all the current $$I_{int} = C_{para}\frac{dV_{in}}{dt}$$

is now routed through S2 to a buffer generating $$\frac{V_{DD}}{2}.$$

The capacitor $C_{para}$ of the sensor discharges at a time constant of $C_{int}*R_{On-S2}$ into the buffer within 1 μs which ensures enough time for discharging across all corners and tested temperatures (−40° C. to 120° C.).

Switches S1 and S2 can be built around a minimum sized transmission gate to minimize leakage current. This secondary current path during transient defines the new limits of oscillation period shown in equation 3. In theory, $T_c$ is higher than defined in equation 3 and now fully depends on $C_{int}$ and G which can now be picked independently from $C_{para}$. With reasonable values of $C_{int}$=10 pF and G=100, the new limit of $T_c$ is improved by 30×; $T_c$=4 ms at 10 G$\Omega$.

Previous works have used a combination of comparator and XOR gate to estimate the value of the parasitics capacitance of the sensor by measuring different timings. This circuitry can be adapted (shown as Comp2 and XOR in FIG. 1) to generate a new signal $V_{out}$ that oscillates twice as fast as $V_c$. Embodiments described herein use circuitry to mitigate the effect of the sensor and the oscillation period is improved by 60× and $T_{out}$=2 ms at 10 G$\Omega$. Compared with previous works mentioned, where the oscillation is computed from front-edge to front-edge, embodiments herein can double the oscillation period by computing the period by 2× and therefore improving the sampling rate by 120× compared to systems not using these approaches.

Figure 3:
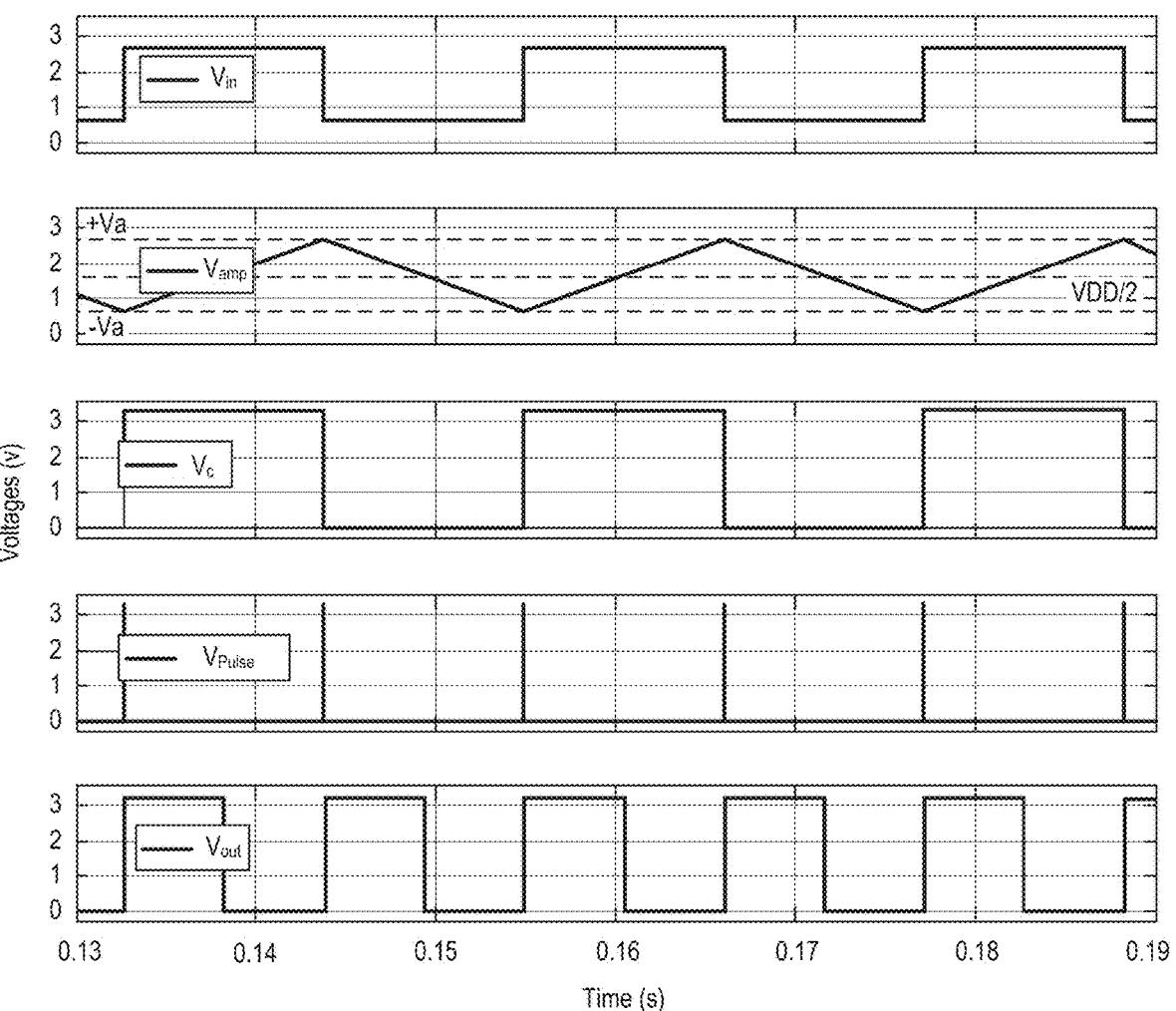
FIG. 3 is a graph of a post-PEX transient simulation of $R_{sen}$=10 GΩ and $C_{para}$=5 pF with parasitic mitigation circuitry in accordance with another example.

FIG. 3 shows the output of the system Vout as well as the control signal $V_{pulse}$ for S1 and S2 of FIG. 1. Additionally, the parasitics mitigation circuitry allows for the use of level-triggered D-latches in FIG. 1 to remove any spurious commutations of the comparators Comp1 and Comp2 due to noise. This is especially useful for higher resistances, when the slope of the triangle waveform $V_{amp}$ is low. These D-latches leverage the additional output of the comparator 2 (Comp2) to get rid of all, or substantially all, spurious commutations. Spurious commutations tend to occur when the triangle wave is very close to the compared voltage. In this case, the comparators such as, for example, Comp1 and Comp2, suffers from noise and the comparator output can oscillate very fast (MHz). Spurious commutations also tend to appear when the oscillating frequency of the loop is very slow (e.g. very high $R_{sen}$). These D-latches are example latches which can be used. Other non-limiting examples of suitable latches can include flip-flops such as JK flip-flop, SR flip-flop, D flip-flop, and T flip-flop.

Generally, spurious commutations create outliers in the measured signals. According to prior solutions, these outliers can be post-processed and removed by software after measurement. Alternatively, or in addition, they can be removed by a low-pass or median filter which can reduce the acquisition bandwidth of the system. In other approaches, an outlier removal algorithm can be used resulting in missing points in the dataset which can make signal processing difficult if too many points are missing. The mitigation circuit described herein can avoid these drawbacks. Effectively, this implementation is similar to a variable hysteresis on the comparators, with the hysteresis level automatically set to the noise level of the system.

The digital system (e.g., digital block) depicted in the lower section of FIG. 1, is intended to accurately measure the duration of the half period on signal $V_{out}$ and then transmit enough information about $V_{out}$ to derive its frequency off-chip. For each channel, the digital controller utilizes a reference clock set to 10 MHz to determine the number of reference clock periods between each falling or rising edge of $V_{out}$.

Special counters called "period counters" can be employed to determine the number of reference clocks, the number of half periods of $V_{out}$, and the value of $V_{out}$ for each channel on each capture. This information is then converted into a 40-bit package and sent via UART (Universal Asynchronous Receiver/Transmitter) to the host per channel every 5 ms. To achieve this, each channel consists of a synchronizer, to align the two clock domains (reference clock and channel in), a debouncer to combat noisy channel input, and a period counter to obtain the frequency information from $V_{out}$.

The digital system uses a multiplexer network to access each period counter output individually, a register file to store output data that is ready to be sent off-chip, a UART transmission block to handle communication and finally, a finite state machine or orchestrate the data movement between the analog front end and UART output.

This example digital system can have a fundamental block which is the period counter, which comprises or consists of counters and registers to obtain the information related to $V_{out}$ frequency. For example, counter 1, synchronous to the reference clock, captures the number of reference clock periods between each $V_{out}$ edge and is asynchronously reset on each $V_{out}$ event, falling for rising. Two more counters are sensitive to $V_{out}$ and are used to monitor the number of half periods.

Synchronous to the channel input and sensitive to the falling and rising edge respectively, individual registers that hold the intermediate values of reference clock count corresponding to rising and falling edges. These registers are updated with the current register values summed with the number of reference clock periods before reset from counter 1. The intermediate values corresponding to rising and falling edges are summed and written to a register file, then stored until the next UART transmission. Typically, all registers and counters, excluding the reference clock counter, are cleared and reset after each UART transmission.

$$Tc > 2 * T_{pulse} = 2 \text{ } \mu s, \tag{3}$$

Figure 4A:
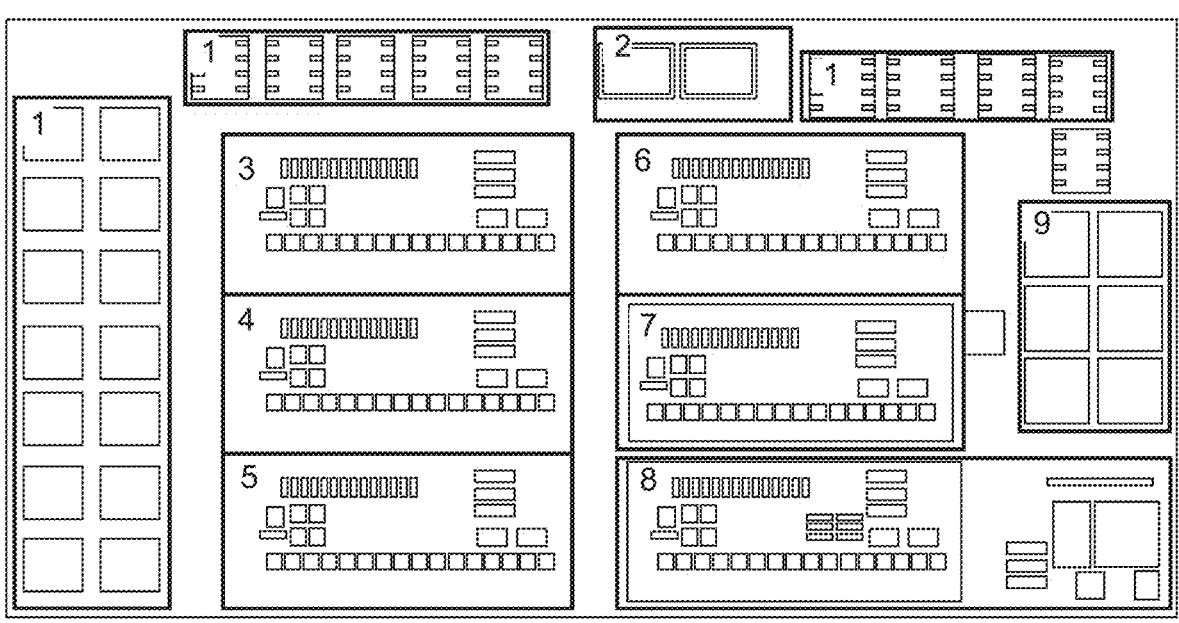
FIG. 4A is a circuit diagram of an analog front-end of a parasitic capacitance mitigation circuit in accordance with one example.

As one example, the analog front-end shown in FIG. 1 (e.g., analog block—1 channel) was designed using the cadence environment in a regular 180 nm CMOS process node across temperature (−40° C. to 120° C.) and corners. Design Rule Check (DRC), Layout Versus Schematic (LVS), and parasitic extraction (PEX) or "DRC/LVS/PEX" have been passed using the Calibre flow and all the results presented here are post-PEX. The layout of the analog front-end from FIG. 1 is shown in FIG. 4A, the area is 540 $\mu$m*270 $\mu$m=0.14 mm2. That is, FIG. 4A depicts the annotated layout of the analog front-end having 1) decoupling capacitors, 2) mitigation circuit, 3) OAI, 4) buffer for shielding the sensor line; 5) Comp1, 6) OA2, 7) Comp2, 8) OA3, and 9) Integration capacitor of 10 picofarad (pF).

In this example, the extra circuitry for mitigating the parasitics can be the 0.0036 $mm^2$ block number two, annotated in FIG. 4A representing 2.5% of the total area. This circuit allowed for a smaller $C_{int}$=10 pF compared to 36 pF previously, representing a total area reduction of 13.5% for the analog front-end. Power consumption increased by 10.5% (+65 $\mu$A) with the extra comparator Comp2 and sampling time is improved by 120×.

Figure 4B:
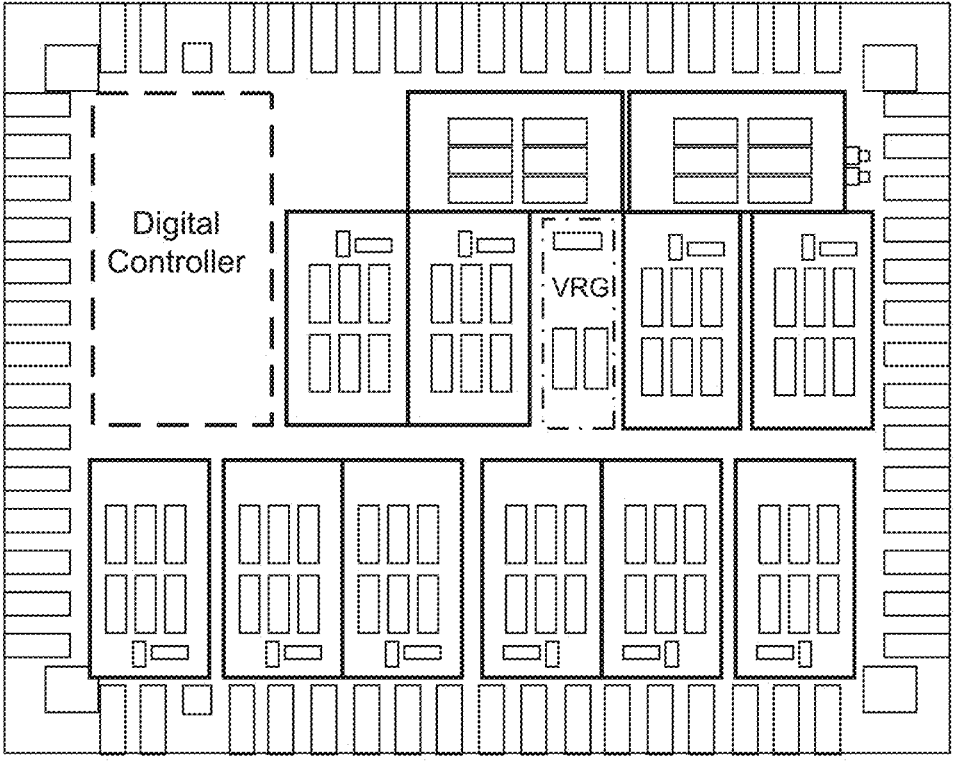
FIG. 4B is a circuit diagram of a 12-channel ASIC of a parasitic capacitance mitigation circuit in accordance with one example.

In this example, the integrated digital controller depicted in FIG. 4B, operating at 10 MHz, consumes 6.23 mW of the total power and represents 870 $\mu$m*420 $\mu$m=0.365 $mm^2$ of the total area. FIG. 4B depicts the annotated layout of the 12 channels ASIC having 1) digital controller, 2) Analog Front-Ends, and 3) Voltage Reference Generator (VRG).

Figure 5:
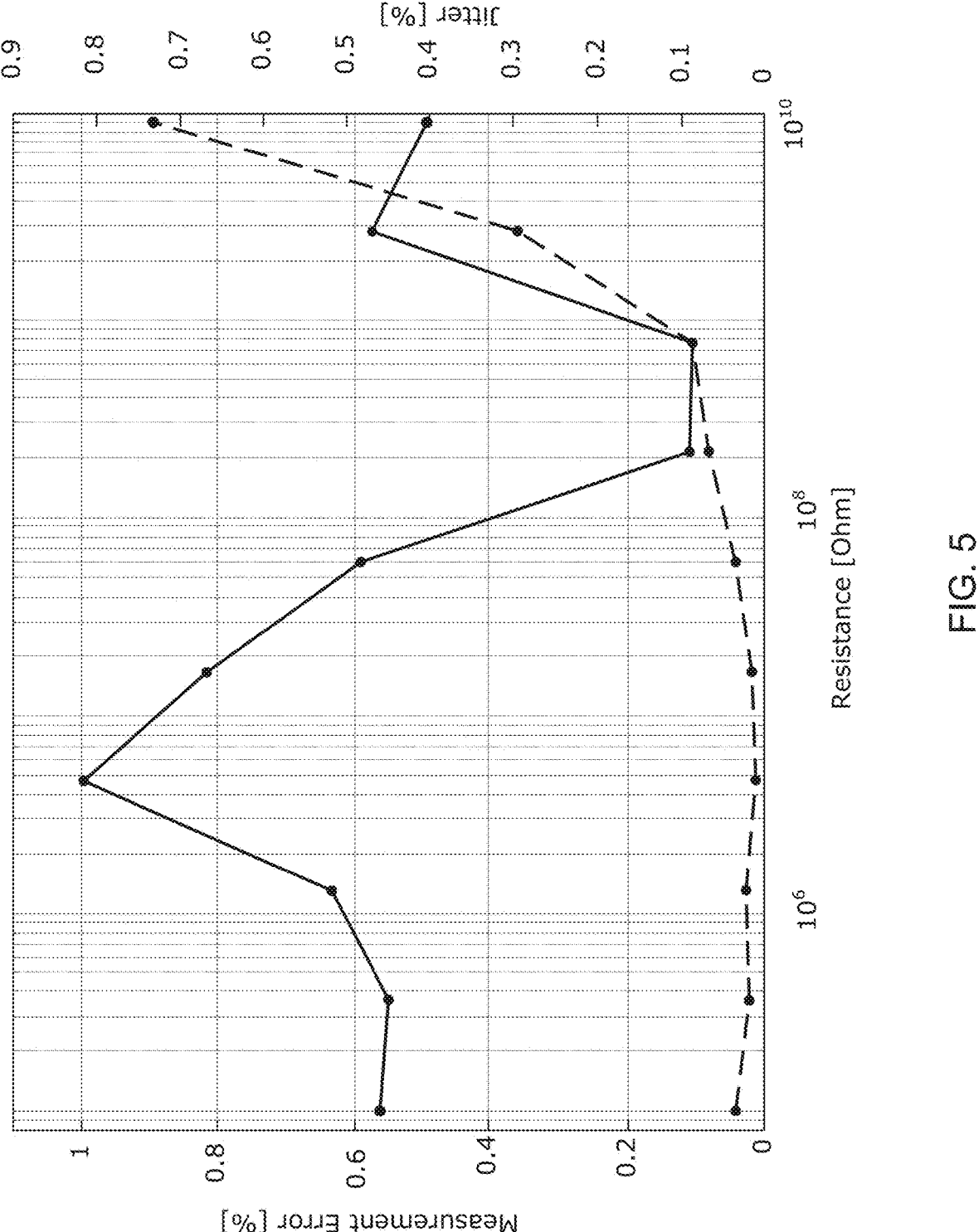
FIG. 5 is a graph of simulated performance results of a measurement errors and jitter parasitic mitigation circuitry in accordance with still another example.

In this example, an experimental setup consisting of ADEx1 (Analog Design Environment) and QuestaSim, a multi-language HDL simulation environment, for analog and digital evaluation was used to estimate the performance of the system for a range of eleven resistances from 100 kiloohms ("k$\Omega$") to 50 G$\Omega$. Analog waveform outputs from ADEx1 output were converted into verilog testbench files and then provided to QuestaSim to obtain approximately fifty UART output measurements for each resistance value over one-half second. These values are then post-processed to account for the encoded 40-bit measurement packet and PWM in $V_{out}$. Jitter of the measurement system is obtained by taking the first standard deviation of the frequency and dividing it by the average value of the recorded frequency values, then represented as percentage in FIG. 5, which illustrates simulated performance results in term of measurement error and jitter.

Similarly, measurement error of the system is obtained by averaging post-processed frequency values for each resistance, then determining the relative error with respect to the expected resistance as a percentage. To accurately estimate the true measurement error of the system, multiple values of G are used to ascertain its effect on the system. The system measurement error is presented in FIG. 5 in terms of the relative error adjusted by the Gain effect evaluation post processing technique. Additionally, the parasitic mitigation circuit (can handle parasitics capacitances up to 30 pF using a gain of 100V/V.

Since air pollution is not only limited to $CO_2$ and PM, but also a complex combination of a wide variety of chemicals in the air, it can be desirable to interface a large array of chemical sensors and monitor their individual responses with ML. The nanofibers sensors are promising technology but their extremely high intrinsic resistance makes them challenging to monitor at high data sampling. The analog front-end (of FIG. 1) offers great benefits in term of sampling frequency (+30×) and area/cost (−13%) for minimal trade-off in terms of power consumption (+80 µA or +10%). Moreover, the integrated digital controller enhances sampling frequency by up to 2× for a maximum sampling frequency of 100 Hz at 50 GΩ. Noise performance of the system has been simulated at 0.5% and the parasitic mitigation circuitry can mitigate the effects of parasitic capacitance up to 30 pF with a power consumption of 9.38 mA.

For further explanation, FIG. 6 sets forth a flow chart illustrating an example method 600, on accordance with some embodiments. The method 600 may be implemented as a method executed as instructions on a machine, where the instructions are included on at least one computer readable medium or one non-transitory machine-readable storage medium.

As shown, method 600 includes monitoring, by a pulse generator, a voltage across a parasitic capacitance of a resistive sensing element, as in block 610. The method 600 also includes detecting, by the pulse generator, a voltage transient across the parasitic capacitance, as in block 620. The method 600 also includes generating, by the pulse generator, a pulse control signal in response to detecting the voltage transient, as in block 630.

The method 600 also includes opening a first switch and closing a second switch in response to the pulse control signal to discharge the parasitic capacitance through the second switch, wherein the first switch coupled across the parasitic capacitance of the resistive sensing element and the second switch is coupled between the parasitic capacitance and a reference voltage node, as in block 640.

In one aspect, in conjunction with and/or as part of at least one block of FIG. 6, the operations of method 600 may include each of the following. The operations of method 600 may also include detecting edges in a feedback signal of the relaxation oscillator; and generating the pulse control signal based on the detected edges in the feedback signal, wherein the detected edges in the feedback signal correspond to the voltage transients across the resistive sensing element.

The operations of method 600 may also include delaying the feedback signal to aligns timing of the pulse control signal with the voltage transient across the resistive sensing element. In one example, the resistive sensing element and the parasitic capacitance are associated with a sensor and the pulse control signal has a pulse width from 1 and 5 microseconds.

The operations of method 600 may also include opening the first switch and closing the second switch to discharge the parasitic capacitance through the second switch to discharge the parasitic capacitance increases an oscillation frequency of the relaxation oscillator, wherein the second switch discharges the parasitic capacitance within 1 and 5 microseconds.

The operations of method 600 may also include filtering spurious output transitions of the comparator caused by noise, where filtering the spurious transitions prevents unstable oscillation behavior of the relaxation oscillator at high resistive sensor values.

While the flowcharts presented for this technology may imply a specific order of execution, the order of execution may differ from what is illustrated. For example, the order of two more blocks may be rearranged relative to the order shown. Further, two or more blocks shown in succession may be executed in parallel or with partial parallelization. In some configurations, one or more blocks shown in the flow chart may be omitted or skipped. Any number of counters, state variables, warning semaphores, or messages might be added to the logical flow for purposes of enhanced utility, accounting, performance, measurement, troubleshooting or for similar reasons.

Some of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more blocks of computer instructions, which may be organized as an object, procedure, or function. Nevertheless, the executables of an identified module need not be physically located together, but may comprise disparate instructions stored in different locations which comprise the module and achieve the stated purpose for the module when joined logically together.

Indeed, a module of executable code can be a single instruction, or many instructions and can even be distributed over several different code segments, among different programs and across several memory devices. Similarly, operational data can be identified and illustrated herein within modules and can be embodied in any suitable form and organized within any suitable type of data structure. The operational data can be collected as a single data set, or can be distributed over different locations including over different storage devices. The modules can be passive or active, including agents operable to perform desired functions.

The technology described here can also be stored on a computer readable storage medium that includes volatile and non-volatile, removable and non-removable media implemented with any technology for the storage of information such as computer readable instructions, data structures, program modules, or other data. Computer readable storage media include, but is not limited to, a non-transitory machine readable storage medium, such as RAM, ROM, EEPROM, flash memory or other memory technology, CD-ROM, digital versatile disks (DVD) or other optical storage, magnetic cassettes, magnetic tapes, magnetic disk storage or other magnetic storage devices, or any other computer storage medium which can be used to store the desired information and described technology.

The devices described herein can also contain communication connections or networking apparatus and networking connections that allow the devices to communicate with other devices. Communication connections are an example of communication media. Communication media typically embodies computer readable instructions, data structures, program modules and other data in a modulated data signal such as a carrier wave or other transport mechanism and includes any information delivery media. A "modulated data signal" means a signal that has one or more of its characteristics set or changed in such a manner as to encode information in the signal. By way of example and not limitation, communication media includes wired media such as a wired network or direct-wired connection and wireless media such as acoustic, radio frequency, infrared and other wireless media. The term computer readable media as used herein includes communication media.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Furthermore, the described features, structures, or characteristics can be combined in any suitable manner in one or more examples. In the preceding description, numerous specific details were provided, such as examples of various configurations to provide a thorough understanding of examples of the described technology. It will be recognized, however, that the technology can be practiced without one or more of the specific details, or with other methods, components, devices, etc. In other instances, well-known structures or operations are not shown or described in detail to avoid obscuring aspects of the technology.

Further Examples

The following are illustrative examples of several embodiments of the present technology:

1. A parasitic capacitance mitigation circuit for a relaxation oscillator comprising:
   a first switch coupled across a parasitic capacitance of a resistive sensing element;
   a second switch coupled between the parasitic capacitance and a reference voltage node;
   a pulse generator configured to:
     monitor a voltage across the parasitic capacitance;
     detect a voltage transient across the parasitic capacitance; and
     generate a pulse control signal in response to detecting the voltage transient, wherein in response to the pulse control signal, the first switch opens and the second switch closes to discharge the parasitic capacitance through the second switch.

2. The parasitic capacitance mitigation circuit of any one of Examples 1-20, wherein the resistive sensing element and the parasitic capacitance are associated with a sensor.

3. The parasitic capacitance mitigation circuit of any one of any one of Examples 1-20, wherein the pulse control signal has a pulse width from 1 and 5 microseconds.

4. The parasitic capacitance mitigation circuit of any one of Examples 1-20, wherein:
   the first switch comprise transmission gates configured to open or close in response to the pulse control signal;
   the second switch comprises transmission gates configured to open or close in response to the pulse control signal; or
   the first and second switches comprise transmission gates configured to open and close complementary to each other in response to the pulse control signal.

5. The parasitic capacitance mitigation circuit of any one of Examples 1-20, wherein the pulse generator is configured to:
   detect edges in a feedback signal of the relaxation oscillator; and
   generate the pulse control signal based on the detected edges in the feedback signal, wherein the detected edges in the feedback signal correspond to the voltage transients across the resistive sensing element.

6. The parasitic capacitance mitigation circuit of any one of Examples 1-20, further comprising a short delay element configured to delay the feedback signal, wherein delaying the feedback signal aligns timing of the pulse control signal with the voltage transient across the resistive sensing element.

7. The parasitic capacitance mitigation circuit of any one of Examples 1-20, wherein the reference voltage node is configured to provide half of a supply voltage.

8. The parasitic capacitance mitigation circuit of any one of Examples 1-20, wherein opening the first switch and closing the second switch to discharge the parasitic capacitance through the second switch to discharge the parasitic capacitance increases an oscillation frequency of the relaxation oscillator.

9. The parasitic capacitance mitigation circuit of any one of Examples 1-20, wherein the second switch discharges the parasitic capacitance within 1 and 5 microseconds.

10. The parasitic capacitance mitigation circuit of any one of Examples 1-20, further comprising a latch coupled to an output of a comparator of the relaxation oscillator.

11. The parasitic capacitance mitigation circuit of claim 10 and any one of Examples 1-20, wherein the latch is configured to filter spurious output transitions of the comparator caused by noise.

12. The parasitic capacitance mitigation circuit of claim 11 any one of Examples 1-20, wherein filtering the spurious transitions prevents unstable oscillation behavior of the relaxation oscillator at high resistive sensor values.

13. A parasitic capacitance mitigation circuit for a relaxation oscillator comprising:
   a first switch coupled across a parasitic capacitance of a resistive sensing element;
   a second switch coupled between the parasitic capacitance and a reference voltage node, wherein the reference voltage node is configured to provide half of a supply voltage;
   a pulse generator configured to:
     monitor a voltage across the parasitic capacitance;
     detect edges in a feedback signal from the relaxation oscillator, wherein the edges correspond to voltage transients across the resistive sensing element;
     generate a pulse control signal in response to detecting the edges corresponding to the voltage transients, wherein in response to the pulse control signal, the first switch opens and the second switch closes to discharge the parasitic capacitance through the second switch to the reference voltage node.

14. The parasitic capacitance mitigation circuit of any one of Examples 1-20, wherein the pulse control signal has a pulse width between 1 and 5 microseconds.

15. The parasitic capacitance mitigation circuit of any one of Examples 1-20, wherein the first and second switches comprise transmission gates configured to open and close complementary to each other.

16. The parasitic capacitance mitigation circuit of any one of Examples 1-20, further comprising a short delay element configured to delay the feedback signal, wherein delaying the feedback signal aligns timing of the pulse control signal with the voltage transient across the resistive sensing element.

17. The parasitic capacitance mitigation circuit of any one of Examples 1-20, further comprising a latch coupled to an output of a comparator of the relaxation oscillator to filter spurious output transitions of the comparator caused by noise.

18. A method of operating a parasitic capacitance mitigation circuit for a relaxation oscillator circuit, comprising:

monitoring, by a pulse generator, a voltage across a parasitic capacitance of a resistive sensing element;

detecting, by the pulse generator, a voltage transient across the parasitic capacitance;

generating, by the pulse generator, a pulse control signal in response to detecting the voltage transient; and opening a first switch and closing a second switch in response to the pulse control signal to discharge the parasitic capacitance through the second switch, wherein the first switch coupled across the parasitic capacitance of the resistive sensing element and the second switch is coupled between the parasitic capacitance and a reference voltage node.

19. The method of any one of Examples 1-20, further comprising:

detecting edges in a feedback signal of the relaxation oscillator; and generating the pulse control signal based on the detected edges in the feedback signal, wherein the detected edges in the feedback signal correspond to the voltage transients across the resistive sensing element.

20. The method of any one of Examples 1-20, further comprising delaying the feedback signal to aligns timing of the pulse control signal with the voltage transient across the resistive sensing element.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements can be devised without departing from the spirit and scope of the described technology.

What is claimed is:

1. A parasitic capacitance mitigation circuit for a relaxation oscillator comprising:

a first switch coupled to a parasitic capacitance of a resistive sensing element;

a second switch coupled between the parasitic capacitance and a reference voltage node; and a pulse generator configured to:

monitor a voltage at a node coupled to the parasitic capacitance;

detect a voltage transient at the node; and generate a pulse control signal in response to detecting the voltage transient, wherein in response to the pulse control signal, the first switch opens and the second switch closes to discharge the parasitic capacitance through the second switch.

2. The parasitic capacitance mitigation circuit of claim 1, wherein the resistive sensing element and the parasitic capacitance are associated with a sensor.

3. The parasitic capacitance mitigation circuit of claim 1, wherein the pulse control signal has a pulse width from 1 and 5 microseconds.

4. The parasitic capacitance mitigation circuit of claim 1, wherein:

the first switch comprise transmission gates configured to open or close in response to the pulse control signal;

the second switch comprises transmission gates configured to open or close in response to the pulse control signal; or the first and second switches comprise transmission gates configured to open and close complementary to each other in response to the pulse control signal.

5. The parasitic capacitance mitigation circuit of claim 1, wherein the pulse generator is configured to:

detect edges in a feedback signal of the relaxation oscillator; and generate the pulse control signal based on the detected edges in the feedback signal, wherein the detected edges in the feedback signal correspond to the voltage transients at the node.

6. The parasitic capacitance mitigation circuit of claim 5, further comprising a short delay element configured to delay the feedback signal, wherein delaying the feedback signal aligns timing of the pulse control signal with the voltage transient at the node.

7. The parasitic capacitance mitigation circuit of claim 1, wherein the reference voltage node is configured to provide half of a supply voltage.

8. The parasitic capacitance mitigation circuit of claim 1, wherein opening the first switch and closing the second switch to discharge the parasitic capacitance through the second switch to discharge the parasitic capacitance increases an oscillation frequency of the relaxation oscillator.

9. The parasitic capacitance mitigation circuit of claim 1, wherein the second switch discharges the parasitic capacitance within 1 and 5 microseconds.

10. The parasitic capacitance mitigation circuit of claim 1, further comprising a latch coupled to an output of a comparator of the relaxation oscillator.

11. The parasitic capacitance mitigation circuit of claim 10, wherein the latch is configured to filter spurious output transitions of the comparator caused by noise.

12. The parasitic capacitance mitigation circuit of claim 11, wherein filtering the spurious transitions prevents unstable oscillation behavior of the relaxation oscillator at high resistive sensor values.

13. A parasitic capacitance mitigation circuit for a relaxation oscillator comprising:

a first switch coupled to a parasitic capacitance of a resistive sensing element;

a second switch coupled between the parasitic capacitance and a reference voltage node, wherein the reference voltage node is configured to provide half of a supply voltage; and a pulse generator configured to:

monitor a voltage at a node coupled to the parasitic capacitance;

detect edges in a feedback signal from the relaxation oscillator, wherein the edges correspond to voltage transients at the node; and generate a pulse control signal in response to detecting the edges corresponding to the voltage transients, wherein in response to the pulse control signal, the first switch opens and the second switch closes to discharge the parasitic capacitance through the second switch to the reference voltage node.

14. The parasitic capacitance mitigation circuit of claim 13, wherein the pulse control signal has a pulse width between 1 and 5 microseconds.

15. The parasitic capacitance mitigation circuit of claim 13, wherein the first and second switches comprise transmission gates configured to open and close complementary to each other.

16. The parasitic capacitance mitigation circuit of claim 13, further comprising a short delay element configured to delay the feedback signal, wherein delaying the feedback signal aligns timing of the pulse control signal with the voltage transient at the node.

17. The parasitic capacitance mitigation circuit of claim 13, further comprising a latch coupled to an output of a comparator of the relaxation oscillator to filter spurious output transitions of the comparator caused by noise.

18. A method of operating a parasitic capacitance mitigation circuit for a relaxation oscillator circuit, comprising:

monitoring, by a pulse generator, a voltage at a node coupled to a parasitic capacitance of a resistive sensing element;

detecting, by the pulse generator, a voltage transient at the node;

generating, by the pulse generator, a pulse control signal in response to detecting the voltage transient; and opening a first switch and closing a second switch in response to the pulse control signal to discharge the parasitic capacitance through the second switch, wherein the first switch coupled to the parasitic capacitance of the resistive sensing element and the second switch is coupled between the parasitic capacitance and a reference voltage node.

19. The method of claim 18, further comprising:

detecting edges in a feedback signal of the relaxation oscillator; and generating the pulse control signal based on the detected edges in the feedback signal, wherein the detected edges in the feedback signal correspond to the voltage transients at the node.

20. The method of claim 19, further comprising delaying the feedback signal to aligns timing of the pulse control signal with the voltage transient at the node.

* * * * *